(12) United States Patent
Ni et al.

(10) Patent No.: US 6,514,378 B1
(45) Date of Patent: Feb. 4, 2003

(54) METHOD FOR IMPROVING UNIFORMITY AND REDUCING ETCH RATE VARIATION OF ETCHING POLYSILICON

(75) Inventors: Tuqiang Ni, Fremont, CA (US); Kenji Takeshita, Fremont, CA (US); Tom Choi, San Jose, CA (US); Frank Y. Lin, Fremont, CA (US); Wenli Collison, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/540,549

(22) Filed: Mar. 31, 2000

(51) Int. Cl.[7] .......................... H05H 1/00; C23C 16/00; H01L 21/00
(52) U.S. Cl. .............. 156/345.51; 156/345.3; 156/345.24; 156/345.48; 118/728; 118/723 I; 438/710
(58) Field of Search ............ 156/345.51, 345.3, 156/345.24, 345.48; 118/728, 723 I, 723 IR; 438/710

(56) References Cited

U.S. PATENT DOCUMENTS

| | | |
|---|---|---|
| 4,948,458 A | 8/1990 | Ogle |
| 5,160,407 A | 11/1992 | Latchford et al. |
| 5,180,464 A | 1/1993 | Tatsumi et al. |
| 5,198,718 A | 3/1993 | Davis et al. |
| 5,241,245 A | 8/1993 | Barnes et al. |
| 5,242,536 A | 9/1993 | Schoenborn |
| 5,304,279 A | 4/1994 | Coultas et al. |
| 5,314,573 A | 5/1994 | Higuchi et al. |
| 5,336,365 A | 8/1994 | Goda et al. |
| 5,368,684 A | 11/1994 | Ishikawa et al. |
| 5,401,350 A | 3/1995 | Patrick et al. |
| 5,411,624 A * | 5/1995 | Hirano et al. ............... 156/345 |
| 5,556,500 A * | 9/1996 | Hasegawa et al. .......... 156/345 |
| 5,560,804 A | 10/1996 | Higuchi et al. |
| 5,571,366 A | 11/1996 | Ishii et al. |
| 5,591,664 A | 1/1997 | Wang et al. |
| 5,665,203 A | 9/1997 | Lee et al. |
| 5,670,018 A | 9/1997 | Eckstein et al. |
| 5,763,327 A | 6/1998 | Blasingame et al. |
| 5,792,692 A | 8/1998 | Li et al. |
| 5,801,077 A | 9/1998 | Chor et al. |
| 5,804,489 A | 9/1998 | Yang et al. |
| 5,861,343 A | 1/1999 | Tseng |
| 5,884,412 A * | 3/1999 | Tietz et al. ..................... 34/58 |

(List continued on next page.)

FOREIGN PATENT DOCUMENTS

| | | |
|---|---|---|
| EP | 0669637 A1 | 8/1995 |
| EP | 0693769 A2 | 1/1996 |
| EP | 0860856 A1 | 8/1998 |
| WO | WO99/14796 A | 3/1999 |
| WO | WO00/07216 A | 2/2000 |

*Primary Examiner*—Gregory Mills
*Assistant Examiner*—P. Hassanzadeh
(74) *Attorney, Agent, or Firm*—Burns, Doane, Swecker & Mathis, LLP

(57) ABSTRACT

An apparatus and method for consecutively processing a series of semiconductor substrates with minimal plasma etch rate variation following cleaning with fluorine-containing gas and/or seasoning of the plasma etch chamber. The method includes steps of (a) placing a semiconductor substrate on a substrate support in a plasma etching chamber, (b) maintaining a vacuum in the chamber, (c) etching an exposed surface of the substrate by supplying an etching gas to the chamber and energizing the etching gas to form a plasma in the chamber, (d) removing the substrate from the chamber; and (e) consecutively etching additional substrates in the chamber by repeating steps (a–d), the etching step being carried out by minimizing a recombination rate of H and Br on a silicon carbide edge ring surrounding the substrate at a rate sufficient to offset a rate at which Br is consumed across the substrate. The method can be carried out using pure HBr or combination of HBr with other gases.

20 Claims, 1 Drawing Sheet

U.S. PATENT DOCUMENTS

| | | | |
|---|---|---|---|
| 5,904,778 A | * | 5/1999 | Lu et al. ................. 118/723 R |
| 5,920,797 A | * | 7/1999 | Ballance et al. ............ 438/758 |
| 5,932,115 A | | 8/1999 | Ho et al. |
| 5,994,234 A | | 11/1999 | Ouchi |
| 6,022,809 A | | 2/2000 | Fan |
| 6,070,551 A | * | 6/2000 | Li et al. .................... 118/723 I |
| 6,200,388 B1 | * | 3/2001 | Jennings ..................... 118/728 |
| 6,227,140 B1 | * | 5/2001 | Kennedy et al. ........ 118/723 R |

\* cited by examiner

METHOD FOR IMPROVING UNIFORMITY AND REDUCING ETCH RATE VARIATION OF ETCHING POLYSILICON

BACKGROUND OF THE INVENTION

1. Field of the Invention

The invention relates to a method of plasma etching polysilicon with HBr and apparatus for improving plasma etching uniformity.

2. Description of the Related Art

Plasma processing systems wherein an antenna coupled to a radiofrequency (RF) source energizes gas into a plasma state within a process chamber are disclosed in U.S. Pat. Nos. 4,948,458; 5,198,718; 5,241,245; 5,304,279; 5,401,350; and 5,571,366. In such systems, the antenna is located outside the process chamber and the RF energy is supplied into the chamber through a dielectric wall or window. Such processing systems can be used for a variety of semiconductor processing applications such as etching, deposition, resist stripping, etc. When such systems are used for plasma etching a batch of consecutively processed semiconductor substrates, the etching rate and/or uniformity may change during the course of etching the batch of substrates. Such variation in etch rate/uniformity is undesirable since the features etched into the substrate may fall outside acceptable product parameters.

Polysilicon etching techniques are disclosed in U.S. Pat. Nos. 5,242,536; 5,314,573; 5,336,365; 5,368,684; and 5,763,327. Of these, the '536 patent discloses anisotropic polysilicon etching in a parallel plate plasma etcher using HBr gas along with $Cl_2$ and He. The '573 patent discloses anisotropic polysilicon etching in a parallel plate plasma etcher using HBr gas along with HCl or $Cl_2$. The '365 patent discloses anisotropic polysilicon etching in an electron cyclotron resonance (ECR) plasma etcher using HBr gas along with $Cl_2$ in a first step and HBr and He in a second step. The '684 patent discloses anisotropic polysilicon etching in a magnetron plasma etcher using HBr gas, a mixture of HBr and $Cl_2$ or a mixture of HBr and HCl. The '327 patent discloses polysilicon etching in a plasma etcher using $Cl_2$, $Br_2$ or HBr, He and $O_2$.

Techniques for etching polysilicon using HBr alone or in combination with other gasses are described in U.S. Pat. Nos. 5,160,407; 5,180,464; 5,560,804; 5,591,664; 5,665,203; 5,670,018; 5,792,692; 5,801,077; 5,804,489; 5,861,343; 5,932,115; and 5,994,234.

U.S. Pat. No. 6,022,809 discloses a composite shadow ring used in a plasma etch chamber, the ring including an insert which does not generate contaminating oxygen gas when bombarded by a gas plasma such as a fluorine-containing plasma. The shadow ring is movably mounted in the bottom of a vacuum chamber such that a wafer can be loaded onto or off of an electrostatic chuck and plasma is generated in the chamber by a coil antenna surrounding a sidewall of the chamber. The shadow ring includes an outer body portion of silicon dioxide and an inner ring-shaped insert portion of silicon. During via etching of a spin-on-glass (SOG) layer the insert is intended to reduce generation of oxygen gas which can inhibit or attack polymeric sidewall passivation layers in the via openings thereby reducing tungsten plug loss near the peripheral edge of the wafer.

While there have been proposals in the prior art to improve polysilicon etch processes and while attempts have been made to prevent generation of oxygen during etching by use of pure silicon materials, there is a need in the art for improvements in etching uniformity of polysilicon.

SUMMARY OF THE INVENTION

The invention provides a method of consecutively processing a series of semiconductor substrates with minimal plasma etch rate variation following cleaning with fluorine-containing gas and/or seasoning of the plasma etch chamber. The method includes steps of (a) placing a semiconductor substrate on a substrate support in a plasma etching chamber, (b) maintaining a vacuum in the chamber, (c) processing the substrate by supplying an HBr-containing etching gas to the chamber and energizing the etching gas to form a plasma in the chamber, (d) removing the substrate from the chamber; and (e) consecutively processing additional substrates in the chamber by repeating steps (a–d), the etching step being carried out by maintaining a recombination rate of H and Br on a member surrounding the substrate at a rate sufficient to offset a rate at which Br is consumed across the substrate.

According to a preferred feature of the invention, the semiconductor substrate can include a layer of polysilicon which is etched with HBr during step (c) and/or the chamber is maintained at a vacuum pressure of less than 100 mTorr during step (c). During step (c) an RF bias of no more than 500 watts can be applied to the substrate by the substrate support.

In the preferred embodiment, the etching gas is energized into a plasma state by a planar or non-planar antenna separated from the interior of the chamber by a dielectric member. Preferably, the dielectric member is at least coextensive with the substrate support and the etching gas is supplied to the chamber by at least one gas inlet in the dielectric member.

BRIEF DESCRIPTION OF THE DRAWINGS

The invention will be described in greater detail with reference to the accompanying drawing wherein.

DETAILED DESCRIPTION OF THE PREFERRED EMBODIMENTS

Figure 1:
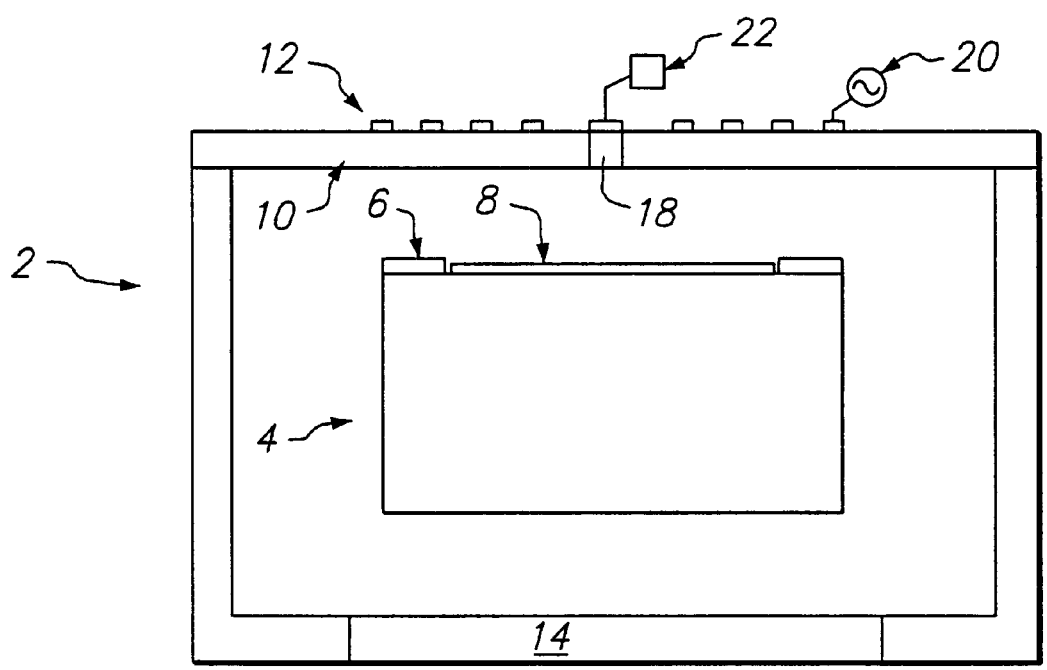
FIG. 1 shows a schematic cross sectional view of a plasma etching chamber which can be used to carry out the method of the invention.

The invention provides an improved plasma etching method capable of providing more repeatable results when etching a batch of consecutively processed semiconductor substrates. In particular, it has been found that during the course of etching a batch of semiconductor wafers, the etch rate can vary significantly depending on whether the etching is preceded by an in-situ chamber clean or seasoning of the chamber by running one or more conditioning wafers through the chamber prior to processing production wafers. According to the invention, it has been surprisingly discovered that the etch rate following cleaning or seasoning can be made more uniform by using silicon carbide as the material of the edge ring surrounding the wafer.

The method of the invention can be carried out in any suitable plasma etch reactor wherein individual substrates are consecutively processed. A preferred plasma etching reactor is an inductively coupled plasma reactor such as shown in FIG. 1. As shown, the apparatus includes a chamber 2, a substrate support 4, an edge ring 6 surrounding a substrate 8, a dielectric window 10, an inductively coupled plasma source 12, and an outlet 14 leading to a vacuum pump. In addition, etching gas is supplied to the chamber through a gas inlet 18 in the dielectric window 10. The plasma source is preferably a planar antenna such as a spiral coil supplied with RF energy from a suitable RF generator 20 and the substrate support preferably includes an electrode supplied with RF energy to apply a suitable RF bias to the substrate. The edge ring 6 can be entirely of CVD SiC or a composite such as sintered SiC or other material coated with SiC. However, it is preferable for the entire surface of the edge ring exposed to the plasma in the chamber to be of silicon carbide. Further, to minimize electrical field effects, the edge ring 6 can have its upper surface located above the exposed surface of the substrate 8, e.g. the top of the edge ring can be 1–2 mm above the surface of the substrate.

According to the invention, the edge ring of silicon carbide provides etch rate stabilization during batch processing of individual semiconductor substrates. Moreover, the edge ring can be maintained free from deposition build-up due to ion bombardment produced by the RF bias. Such self cleaning is advantageous in maintaining the etch rate stabilization since deposition on the edge ring can alter H and Br recombination which causes etch rate drift. The reactor can include any suitable source for generating plasma in the chamber (e.g., parallel plate, inductive coupled, ECR, magnetron, helicon, etc.) and any suitable gas supply for delivering etching gas into the chamber (e.g., a gas ring, showerhead, gas injector mounted in an opening extending through the dielectric window, etc.).

In the embodiment shown in FIG. 1, the vacuum processing chamber preferably includes a substrate holder providing an electrostatic clamping force to a substrate and the edge ring confines the plasma in an area above the substrate while it is He backcooled. A source of energy for maintaining a high density (e.g. at least $10^9$ ions/cm$^3$) plasma in the chamber such as a planar antenna powered by a suitable RF source and associated RF impedance matching circuitry can be used to inductively couple RF energy into the chamber so as to provide a high density plasma. A vacuum pump preferably maintains the interior of the chamber at a desired pressure (e.g., below 50 mTorr, typically 1–20 mTorr).

The reactor shown in FIG. 1 includes a substantially planar dielectric window 10 of uniform thickness between the antenna 12 and the interior of the processing chamber. However, other antenna and/or widow configurations can be used such as a non-planar antenna and/or a non-planar dielectric window. Further, while any suitable gas supply arrangement can be used, in the embodiment shown a centrally located gas inlet 18 is provided in the dielectric window. The inlet 18 can be supplied gas from one or more gas supplies 22. The substrate holder can include conventional features such as a lift pin arrangement (not shown) for lifting the substrate.

According to the invention it has been discovered that use of a silicon carbide edge ring can improve HBr etch uniformity. In order to compare the effectiveness of a silicon carbide edge ring to other materials, tests were carried out using edge rings of quartz, silicon nitride and alumina. Compared to these other materials, the silicon carbide edge ring provides a much more repeatable etch rate after chamber cleaning using fluorine-based gas chemistries or after chamber seasoning wherein conditioning wafers are processed prior to etching production wafers. A diode laser was used to measure HBr dissociation percentages during polysilicon etching. The tests were carried out after chamber seasoning (wherein 6 bare silicon wafers were processed prior to processing production wafers) and after waferless cleaning (WAC) of the chamber (wherein the chamber was cleaned using a fluorine-based cleaning gas while the substrate support was uncovered). The plasma etch chamber used in the tests was a LAM 2300™ etch chamber and quartz, alumina and silicon carbide were used as edge ring materials. The dissociation percentages are set forth in the following table.

| Edge Ring | Quartz | Alumina | Silicon Carbide |
| --- | --- | --- | --- |
| After Seasoning | 69.2% | 62.9% | 52.0% |
| After WAC | 52.1% | 50.3% | 50.15 |

During plasma etching of polysilicon with HBr, silicon combines with Br and is removed as a gas. Accordingly, it is desirable to maintain an HBr dissociation rate at the inner portion of an etched wafer at the same rate as at the outer periphery of the wafer. However, because different edge ring materials cause H and Br to recombine at different rates, edge ring materials which provide a high H and Br recombination rate can be used to provide an etch rate at the outer periphery of the wafer at the same rate as at the center of the wafer. In contrast, if the recombination rate at the edge ring is low, nonuniform etching can result since more Br is available for etching the periphery of the wafer compared to the inner portion of the wafer.

According to the invention, uniformity of polysilicon etching can be improved by increasing the recombination rate at the edge of the wafer. In particular, the edge ring material is selected to increase the recombination rate and the width of the edge ring can be increased to enhance this effect. For example, in a chamber designed to etch 200 mm wafers, the edge ring width can be selected to be at least 10% of the wafer diameter, i.e., at least 20 mm, preferably 25 mm or wider in the case of a 200 mm wafer.

A silicon carbide edge ring in accordance with the invention provides additional advantages. For instance, compared to an alumina edge ring which can be a source of aluminum contamination, an edge ring made of high purity silicon carbide such as chemically deposited SiC (CVD SiC) does not present such contamination problems. Compared to a quartz edge ring which is chemically attacked by fluorine-based cleaning gas chemistries, a silicon carbide edge ring is more chemically stable. Further, when it is desired to carry out polysilicon etching at a target etch rate after WAC or chamber seasoning, a silicon carbide edge ring provides the least affected polysilicon etch rate compared to a quartz edge ring, a silicon nitride edge ring or an alumina edge ring.

The process according to the invention can be carried out using pure HBr or HBr in combination with other gases. For instance, the polysilicon etch can be carried out using HBr alone or in combination with one or more other gases during main etching and the gas chemistry can be changed during overetching. An example of suitable gas chemistries follows.

According to a first embodiment of etching polysilicon such as masked silicide/polysilicon layers, the main etch can be carried out using HBr and $Cl_2$ with or without non-etching gases such as argon, helium or nitrogen. If desired, the $Cl_2$ could be replaced with another Cl source such as HCl. The process parameters such as power to the plasma source, wafer temperature, RF bias, chamber vacuum pressure, etc. can be set in accordance with the type of plasma reactor being used. For an inductively coupled plasma source, the antenna power can be in the range of 200 to 1000 watts, the temperature of the wafer can be 10 to 100° C., the chamber pressure can be 5 to 50 mTorr, the RF bias can be less than 500 watts, etc. In the overetching step, the gas can be modified to include oxygen and helium. For instance, the overetch can be carried out using HBr, $Cl_2$, He and $O_2$. Alternatively, the $Cl_2$ can be terminated during the overetching step.

According to a second embodiment, a polycide film comprising a lower layer of doped polysilicon and an upper layer of tungsten silicide can be etched using HBr and $SF_6$ and overetching can be carried out by terminating the supply of $SF_6$ and adjusting the flow of HBr to a desired level. Other fluorine gases besides $SF_6$ can also be used, such gases including $NF_3$, $ClF_3$, $F_2$, HF, $C_2F_6$, $CHF_3$, $CF_4$, $CH_2F_6$, $C_3F_8$, $C_4F_8$, or the like. Further, $N_2$ and/or $O_2$ can be added for sidewall protection and gases such as argon and/or helium can be added for sputtering, dilution or cooling effects, if desired.

According to a third embodiment, the polysilicon etching can be preceded by a step of removing any surface oxide on the polysilicon layer. For instance, a surface oxide which may have formed on a polysilicon layer during a preceding step such as stripping of a lithographic mask can be removed using a suitable gas such as $CF_4$. Then, the polysilicon on a 300 mm wafer can be etched using a mixture of 50–300 sccm HBr, 20–150 sccm $Cl_2$, 1–20 sccm of a $He/O_2$ mixture (e.g., 70% He and 30% $O_2$). In a following step the $Cl_2$ can be terminated and in a third step to achieve overetching the power and chamber pressure can be reduced while using the $Cl_2$-free HBr and $He/O_2$ gas mixture.

In a fourth embodiment, a tungsten silicide layer can be etched with a $Cl_2/O_2$ mixture and a doped polysilicon layer beneath the tungsten silicide film can be etched with HBr alone or a $HBr/O_2$ mixture. During the etching steps, the plasma source power can be adjusted to provide a desired plasma density. For instance, the plasma density can be adjusted on the order of $1\times10^{10}$ $cm^{-3}$. However, lower plasma densities on the order of $1\times10^9$ $cm^{\times3}$ or higher plasma densities on the order of at least $1\times10^{11}$ $cm^{33\ 3}$ can also be used.

The foregoing has described the principles, preferred embodiments and modes of operation of the present application. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A method of consecutively processing individual semiconductor substrates with minimal plasma etch rate variation following cleaning with a fluorine-containing gas and/or seasoning of the plasma etching chamber using the plasma etching apparatus according to claim 10, the method comprising the steps of:
   (a) placing a semiconductor substrate on the substrate support in the plasma etching chamber such that the edge ring is separated from the substrate by a clearance gap which is just large enough to allow the substrate to be lowered onto and raised off of the substrate support without contacting the inner periphery of the edge ring;
   (b) maintaining a vacuum in the chamber;
   (c) etching an exposed polysilicon surface of the polysilicon layer of the substrate by supplying the HBr-containing etching gas to the chamber and energizing the etching gas using the antenna to form a plasma in the chamber;
   (d) removing the substrate from the chamber, and
   (e) consecutively etching additional substrates in the chamber by repeating steps (a–d), the etching step being carried out by minimizing a recombination rate of H and Br on a member surrounding the substrate at a rate sufficient to offset a rate at which Br is consumed across the substrate.

2. The method according to claim 1, wherein the semiconductor substrate is a silicon wafer having a layer of polysilicon which is etched with pure HBr during step (c).

3. The method according to claim 1, wherein the chamber is maintained at a vacuum pressure of less than 100 mTorr during step (c).

4. The method according to claim 1, wherein during step (c) an RF bias is applied to the substrate by the substrate support such that the RF bias minimizes deposition build-up on the edge ring.

5. The method according to claim 1, wherein the etching step is preceded by a step of in-situ cleaning and/or seasoning the chamber.

6. The method according to claim 1, wherein an upper surface of the edge ring is located above the exposed polysilicon surface.

7. The method according to claim 1, wherein the dielectric member is at least coextensive with the substrate support.

8. The method according to claim 7, wherein the etching gas is supplied to the interior of the chamber through at least one inlet in the dielectric member.

9. A plasma etching apparatus for etching a polysilicon layer on a substrate with a plasma generated from an HBr-containing etching gas, the plasma etching apparatus comprising:
   a plasma etching chamber having a substrate support in an interior thereof, the chamber including a dielectric member facing the substrate support;
   means for supplying an HBr-containing etching gas into the interior of the chamber;
   an antenna separated from the interior of the chamber by the dielectric member, the antenna passing RF energy through the dielectric member and energizing the etching gas into a plasma state;
   a vacuum pump evacuating the interior of the chamber;
   a silicon carbide edge ring around a periphery of the substrate support; and
   a substrate including a polysilicon layer to be etched, the substrate being located on the substrate support such that the edge ring is separated from the substrate by a clearance gap which is just large enough to allow the substrate to be lowered onto and raised off of the substrate support without contacting the inner periphery of the edge ring;
   wherein the edge ring has a width in a plane parallel to the polysilicon layer, the width being at least 20% of a maximum dimension of the substrate in the plane.

10. The plasma etching apparatus of claim 9, wherein the vacuum pump maintains the interior of the chamber at a vacuum pressure of less than 100 mTorr.

11. The plasma etching apparatus of claim 9, wherein the substrate support includes an electrode applying an RF bias of no more than 500 watts to the substrate.

12. The plasma etching apparatus of claim 9, wherein the edge ring consists of CVD SiC.

13. The plasma etching apparatus of claim 9 wherein the edge ring comprises sintered SiC coated with CVD SiC.

14. The plasma etching apparatus of claim 9 wherein the edge ring extends from an outer periphery of the substrate support to the outer edge of the substrate.

15. The plasma etching apparatus of claim 9 wherein the dielectric member is at l east coextensive with the substrate support.

16. The plasma etching apparatus of claim 15, wherein the dielectric member includes at least one inlet through which the etching gas is supplied to the interior of the chamber.

17. The plasma etching apparatus of claim 9, wherein the substrate comprises a silicon wafer having a layer of polysilicon, and the means for supplying supplies HBr and $Cl_2$ into the chamber.

18. The plasma etching apparatus of claim 9, wherein the edge ring has an upper surface spaced sufficiently above the substrate to compensate for field effects at the edge of the substrate.

19. A plasma etching apparatus for etching a polysilicon layer on a substrate with a plasma generated from an HBr-containing etching gas supplied by a gas supply, the plasma etching apparatus comprising:

a plasma etching chamber having an interior and a substrate support in the interior;

a gas source of an HBr-containing etching gas;

means for supplying the HBr-containing etching gas from the gas source into the interior of the chamber;

means for energizing the etching gas into a plasma state;

a substrate including a polysilicon layer, the substrate having an outer edge; and a silicon carbide edge ring disposed around a periphery of the substrate support and separated from the outer edge of the substrate by a clearance gap, the silicon carbide edge ring having a width in a plane parallel to the polysilicon layer, the width being at least 20% of a maximum dimension of the substrate in the plane, the edge ring having a flat upper surface disposed above the polysilicon layer, wherein the silicon carbide edge ring is effective to increase the recombination rate of H and Br at the outer edge of the substrate during etching of the polysilicon layer with the plasma.

20. In a plasma etching apparatus for etching a polysilicon layer on a substrate with a plasma generated from an HBr-containing etching gas, the plasma etching apparatus including a plasma etching chamber and a substrate support in the plasma etching chamber, the improvement comprising:

a silicon carbide edge ring disposed around a periphery of the substrate support and separated from an outer edge of the substrate by a clearance gap, the silicon carbide edge ring having a width in a plane parallel to the polysilicon layer, the width being at least 20% of a maximum dimension of the substrate in the plane, the edge ring having a flat upper surface disposed above the polysilicon layer, wherein the silicon carbide edge ring is effective to increase the recombination rate of H and Br at the outer edge of the substrate during etching of the polysilicon layer with the plasma.

* * * * *